United States Patent [19]

Jarvinen

[11] Patent Number: 5,761,635
[45] Date of Patent: Jun. 2, 1998

[54] METHOD AND APPARATUS FOR IMPLEMENTING A LONG-TERM SYNTHESIS FILTER

[75] Inventor: Kari Juhani Jarvinen, Tampere, Finland

[73] Assignee: Nokia Mobile Phones Ltd., Salo, Finland

[21] Appl. No.: 639,718

[22] Filed: Apr. 29, 1996

Related U.S. Application Data

[63] Continuation of Ser. No. 238,157, May 4, 1994, abandoned.

[30] Foreign Application Priority Data

May 6, 1993 [FI] Finland ................................ 932049

[51] Int. Cl.$^6$ ................................................ G10L 3/02
[52] U.S. Cl. .................... 704/223; 704/220; 704/219; 704/263; 704/262
[58] Field of Search ...................... 395/2.16, 2.25, 395/2.26, 2.28–2.32, 2.34; 704/223, 207, 216, 217, 219–222, 225, 262–264, 258

[56] References Cited

U.S. PATENT DOCUMENTS

| | | | |
|---|---|---|---|
| 4,618,982 | 10/1986 | Horvath et al. | 381/36 |
| 4,831,624 | 5/1989 | McLaughlin et al. | 371/37 |
| 4,969,192 | 11/1990 | Chen et al. | 381/31 |
| 5,073,940 | 12/1991 | Zinser et al. | 381/47 |
| 5,097,507 | 3/1992 | Zinser et al. | 381/31 |
| 5,138,662 | 8/1992 | Amano et al. | 381/36 |
| 5,148,489 | 9/1992 | Erell et al. | 381/47 |
| 5,177,799 | 1/1993 | Naitoh | 381/34 |
| 5,224,167 | 6/1993 | Taniguchi et al. | 381/36 |
| 5,235,669 | 8/1993 | Ordentlich et al. | 395/2 |
| 5,265,167 | 11/1993 | Akamine et al. | 381/40 |
| 5,293,449 | 3/1994 | Tzeng | 395/2.32 |
| 5,325,374 | 6/1994 | Hoshi et al. | 371/43 |
| 5,327,519 | 7/1994 | Haggvist et al. | 395/2.28 |
| 5,359,696 | 10/1994 | Geison et al. | 395/2.32 |
| 5,432,884 | 7/1995 | Kapanen et al. | 395/2.37 |

FOREIGN PATENT DOCUMENTS

| | | | |
|---|---|---|---|
| 0 154 381 | 9/1985 | European Pat. Off. | G10L 9/14 |
| 0 195 487 | 9/1986 | European Pat. Off. | G10L 9/14 |
| 0 266 620 | 5/1988 | European Pat. Off. | G10L 9/14 |
| 0 316 112 | 5/1989 | European Pat. Off. | G10L 5/06 |
| 0 361 432 | 4/1990 | European Pat. Off. | G10L 9/14 |
| 0 379 296 | 7/1990 | European Pat. Off. | G10L 9/14 |
| 0 401 452 | 12/1990 | European Pat. Off. | G10L 9/14 |
| 0 532 225 A2 | 3/1993 | European Pat. Off. | |
| 2 258 978 | 2/1993 | United Kingdom | |
| WO 89/02148 | 3/1989 | WIPO | G10L 9/14 |
| WO 92/16065 | 9/1992 | WIPO | H04L 1/00 |
| WO 92/22891 | 12/1992 | WIPO | G10L 9/14 |

OTHER PUBLICATIONS

"Signal Compression Based on Models of Human Perception" Jayan et al.IEEE/Oct. 1993, vol. 81, #10 Proceedings of the IEEE.

"Subband Vector Excitation Coding With Adaptive Bit-Allocation", Young et al., IEEE/May 1989.

"Adaptive Bit-Allocation Between the Pole-Zero Synthesis Filter and Excitation in CELP" Miseki et al., IEEE/May 1991.

"Frame Substitution and Adaptive Post-Filtering in Speech Coding", C. Sereno, Eurospeech-1991, pp. 595-598.

Primary Examiner—Kee M. Tung
Attorney, Agent, or Firm—Perman & Green,LLP

[57] ABSTRACT

A synthesis filter is disclosed which models the effect of the fundamental frequency of speech for digital speech coders operating on the analysis-by-synthesis principle. High fundamental frequencies having a period shorter than the corresponding cycle length of the frame employed in the analysis-by-synthesis method are optimally encoded. The filter is constructed of a number of parallel, separately updatable synthesis-memory blocks. When analysis delays shorter than the analysis frame are used, a portion of a signal that was stored in memory several frames earlier is selected and scaled to approximate the missing portion of the analysis frame using the available portion of the analysis frame.

19 Claims, 8 Drawing Sheets

METHOD AND APPARATUS FOR IMPLEMENTING A LONG-TERM SYNTHESIS FILTER

This is a continuation of application(s) Ser. No. 08/238, 157 filed on May 4, 1994, now abandoned.

BACKGROUND OF THE INVENTION

Field of invention

The invention relates to a method and apparatus for implementing a long-term synthesis filter which models the effect of the fundamental frequency of speech, particularly filters for digital speech encoders and decoders operating on the analysis-by-synthesis principle.

Discussion of Related Art

FIG. 1 shows an encoder in accordance with the prior art. In the encoder the analysis-by-synthesis method is used to calculate parameter values for a long-term predictive filter (which is also known as the fundamental frequency filter; LTP filter, Long-Term Prediction; or "adaptive" code book). In the coder shown in FIG. 1 each excitation vector residing in the memory of long-term synthesis filter 101, at locations associated with different delay values, is amplified appropriately and applied to the short-term LPC synthesis filter 102 as an excitation. LPC (Linear Predictive Coding) is a generally known method used to code the short-term sample characteristics of a speech signal.

The signal synthesized by means of each excitation vector is further compared with the target signal 103 in the subtraction means 104, whereby the synthesis error is identified. The target signal can be an original speech signal which it is desired to have coded or a signal provided by some previous coding operation. The error signal is generally then weighted in weighting filter 105 to improve speech quality from the standpoint of human auditory perception. The power level of the error signal is calculated in power calculating block 106 and the error power level calculated for each excitation vector is supplied to the code book's search controller 107, which searches the vector residing in the synthesis filter's memory to find the excitation signal in the vector which produces the smallest weighted error signal. The delay value $D_{opt}$ 108 corresponding to the best excitation signal in the vector as well as the scaling coefficient $b_{opt}$ 109 are relayed ahead to the decoder.

The long-term synthesis filter can be considered an adaptive code book in which the excitation signal of a few previous frames is stored in memory. The content of the memory is updated by storing each newly-formed signal in memory and dropping the excitation signals in the respective oldest excitation frame from the memory, operating as a type of LIFO buffer.

In conjunction with the search for the parameters of the long-term synthesis filter according to FIG. 1, it is possible to search a fixed code book such that the long-term synthesis error signal obtained from adder 104 is routed ahead for processing in an analysis-by-synthesis processing stage similar to that in which the fixed code book is searched to find the best fixed excitation vector. For the sake of simplicity, a long-term analysis-by-synthesis search that is carried out separately from the processing of the fixed code book will be dealt with by way of example. The search can also be carried out jointly for the adaptive and fixed code books mentioned by supplying the excitation vector of the fixed code book to the input 100 of the long term synthesis filter. More code books than one adaptive and one fixed code book can, naturally, also be used.

FIG. 2 shows different types of synthesis filter delays. The figure illustrates a situation involving a delay that is greater than the length of a sub-frame (case I) as well as a situation involving a delay that is shorter than the sub-frame (case II). When searching for an appropriate excitation vector for frame J+1, the content of the sub-frames which precede this and have been stored in memory are searched for an appropriate portion to be used as an excitation signal. The dashed-line trace in the figure is the excitation for the frame J+1, which is currently under search and is thus still unknown at the time of the search which is currently being described. Drawn separately in the figure are two cases on the basis of whether the delay D that is permissible in the system is smaller than the sub-frame L (the analysis frame used in coding the long-term excitation). In case I the delay has been limited so as to be no shorter than the sub-frame, whereby the excitation signal is obtained by means of a straightforward method based on calculating correlations. The unamplified excitation signal to be used in optimizing the excitation parameters is obtained as follows:

$$exi_D(n) = buff(K-D+n-1); \; n=1, \ldots, L, \quad (1)$$

where K is the pointer to the end of the filter memory or buffer. The actual, scaled excitation vector is obtained as follows $$exi(n) = b_{opt} * exi_{Dopt}(n); \; n=1, \ldots, L. \quad (2)$$

The optimal delay value $D_{opt}$ is obtained by means of an analysis-by-synthesis search according to a method known in the art, by first forming the LPC synthesis filter's response $V_D(n)$ for each unscaled excitation signal $exi_D(n)$ and by searching, in the entire area $n=1, \ldots, L$ of the sub-frame, for the delay value D maximizing the value of the correlation term R(D). The parameter $D_{opt}$ is the fundamental cycle measured from the speech signal. Where a speech signal is involved, the term "fundamental frequency" is often used instead of fundamental cycle. This value is the inverse of the fundamental cycle and it expresses the frequency at which human vocal cords vibrate.

$$R(D) = \frac{\left( \sum_{i=1}^{L} v_D(i) s(i) \right)^2}{\sum_{i=1}^{L} v_D^2(i)} \quad (3)$$

in which $s(i); \; i=1, \ldots L$ is the signal to be modelled.

The optimal scaling coefficient $b_{opt}$ for each excitation vector to generate a synthesized signal $V_D(n)$ is obtained from a term that is well known in the art $$b = \frac{\left( \sum_{i=1}^{L} v_D(i) s(i) \right)}{\sum_{i=1}^{L} v_D^2(i)} \quad (4)$$

A search for the best possible excitation can thus be made in quite a straightforward manner in the case described above.

The situation is different if the method permits the use of delay values that are smaller than the sub-frame, i.e., as happens in case II shown in FIG. 2. In this case the response of the synthesis filters would have to be calculated for a part of the excitation signal not yet known, since the start of sampling occurs at a point K-D in the buffer and if D<L then the latter samples (L-D) fall outside of the buffer region. This is a consequence of buffering a sub-frame of L samples. The fundamental cycle P of the excitation signal shown in the example of FIG. 2 is clearly smaller than the sub-frame length L. Efficient coding would call for the use of a delay value that is shorter than L in the long-term synthesis filter.

From the standpoint of the feasibility of the analysis-by-synthesis search it makes sense to keep the sub-frame sufficiently long so that, on the one hand, the computational load (the number of optimizations of the excitations per unit of time) can be kept reasonably low, and so that on the other hand the number of excitation-describing parameters to be sent to the decoder is kept reasonably low in order to keep the bit rate low. It is also expedient to carry out optimization of the excitation with a correlation interval that is sufficiently large from the standpoint of the efficiency of the coding method. In practice a sub-frame about 5 ms in length has proved to be a good choice from the standpoint of the method's performance and efficiency. However, this choice leads to a situation in which the smallest fundamental frequency that can be implemented with a long-term synthesis filter is 200 Hz. The fundamental frequency for female speakers can be substantially over 300 Hz. This is why the coding result in prior art systems, especially for female speakers having a high fundamental frequency, is markedly poorer than the coding result for male speakers.

The problem can be eliminated by using very small sub-frame lengths, which are shorter than the speech signal's shortest possible fundamental cycle. However, this solution only improves the coding of the signal significantly in terms of the fundamental frequency, and it excessively increases the computational load required to implement it, thereby reducing the efficiency of the coding.

One solution for coding high fundamental frequencies of a speech signal is to modify the long-term synthesis filter such that when having to use a sub-frame having samples that are currently undergoing optimization (unknown samples), i.e. when the latter samples (L-D) fall outside the buffer region, samples corresponding to the region outside the buffer are taken from samples previous to D.

The previous samples are substituted for the excitation values that fall outside the buffer (or they are taken from samples preceding D's multiple in such a way that a signal is taken from the known area in the LTP memory to represent the unknown signal). See, for example, U.S. Pat. No. 4,980,916 and to patent WO-91/03790. The difficulty with this method is the fact that the intensity of the excitation signal can change significantly when proceeding to the next sub-frame, and then the excitation signal previous to sample value D the excitation signal that was used in the coding does not correspond to the actual excitation.

SUMMARY OF THE INVENTION

In a first aspect of the invention there is provided a method for operating a long-term synthesis filter (LTP) utilizing an analysis-by-synthesis procedure, comprising the steps of: reading signals of a predetermined length stored in an adaptive code book and utilizing the signals for forming respective synthesis signals, comparing respective synthesis signals with a target signal and forming an error signal indicative of the correlation between respective synthesis signals and the target signal. The signal producing the greatest correlation is used for synthesis and store, whereby a plurality of separately adaptable adaptive code books are provided and the signal having the greatest correlation is stored in one of the plurality of adaptive code books. This aspect provides a long-term synthesis filter (LTP) for utilizing an analysis-by-synthesis procedure, comprising more than one adaptive code book individually selectable for updating and use with a signal undergoing coding.

In a second aspect of the invention a method for operating a long-term synthesis filter (LTP) utilizing an analysis-by-synthesis procedure is provided comprising the steps of: reading signals of a predetermined length stored in an adaptive code book for different delay values (D) and utilizing the signals to produce respective synthesis signals, comparing respective synthesis signals with a target signal and forming an error signal indicative of the correlation between respective synthesis signals and the target signal. The signal producing the greatest correlation is used for synthesis and stored in the adaptive code book. An auxiliary memory means is used for storing the signal producing the greatest correlation for delay values (D) less than or equal to a predetermined length. This aspect provides a long-term predictive synthesis filter (LTP) for utilizing an analysis-by-synthesis procedure, comprising an auxiliary memory means corresponding to an adaptive code book for storing signals when delay values (D) are less than or equal to a predetermined length.

A method and apparatus in accordance with the invention can be used in the digital coding of a speech signal. In particular, it can be employed to advantage in seeking to transmit a high-quality speech signal with low bit rates under 10 kbit/s. The method can be used, for example, in Code Excited Linear Predictive Coding (CELP coding). With the invention, an improved speech coding result can be achieved in analysis-by-synthesis methods akin to CELP coding, especially at the low bit rates mentioned. CELP coding has been discussed, for example, in the publication M. R. Schroeder and B. S. Atal: "Code-Excited Linear Prediction (CELP); High Quality Speech at Very Low Bit Rates", Proceedings of the IEEE International Conference of Acoustics, Speech and Signal Processing ICASSP, Vol. 3, p. 937–940, March 1985.

Advantageously, a good coding result is achieved for the kinds of voices whose fundamental frequency is very high, i.e., in the case when the cycle time corresponding to the fundamental frequency is shorter than the analysis-by-synthesis frame used. The use of several parallel separately updated synthesis memory blocks in the synthesis filter makes it possible to further improve the operation and coding result of the synthesis filter. For example, useful signals which occurred many cycles earlier may be stored and reused.

DETAILED DESCRIPTION OF EMBODIMENTS OF THE INVENTION

Figure 1:
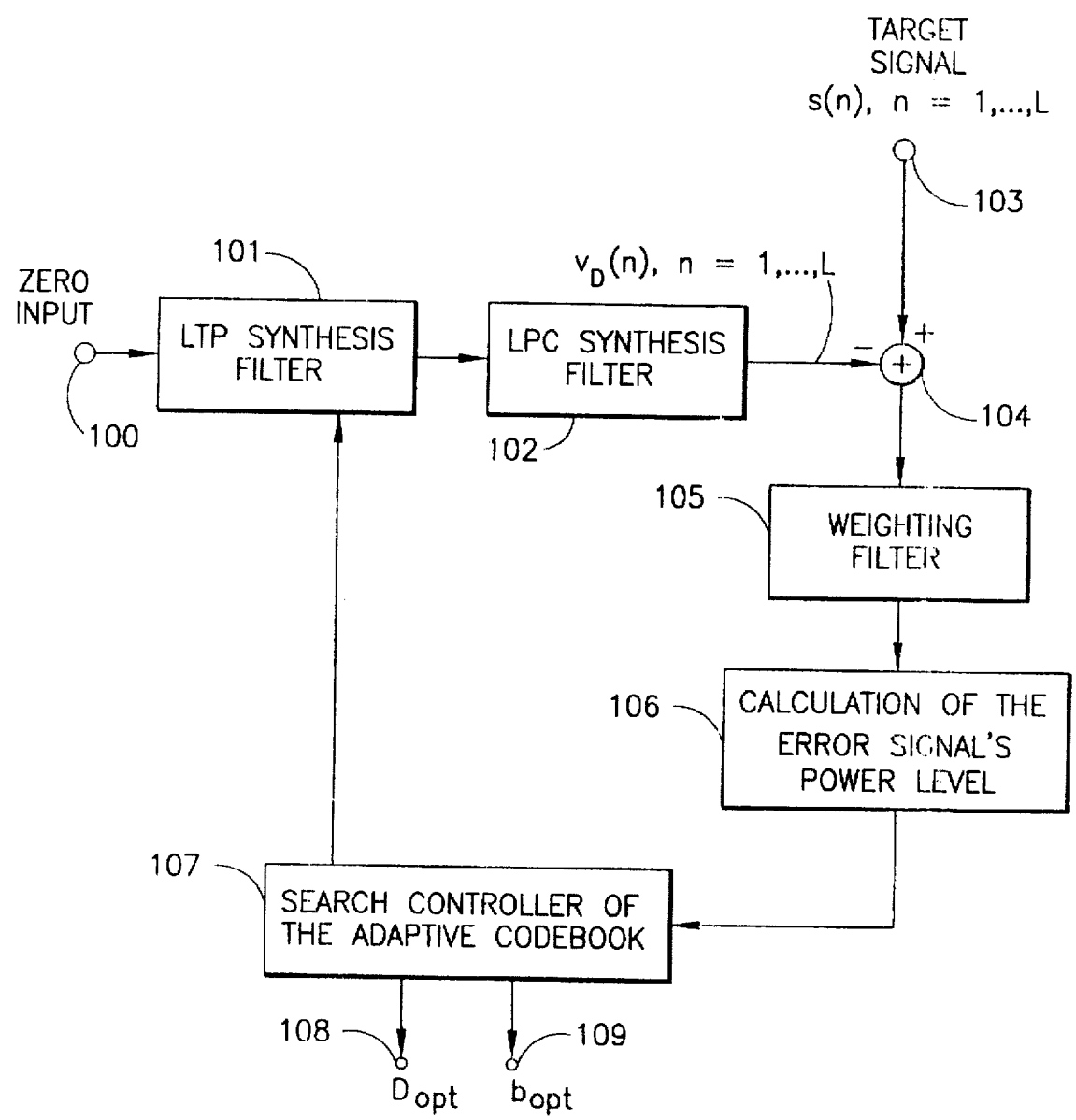
FIG. 1 shows the already discussed encoder in accordance with prior art.
Figure 2:
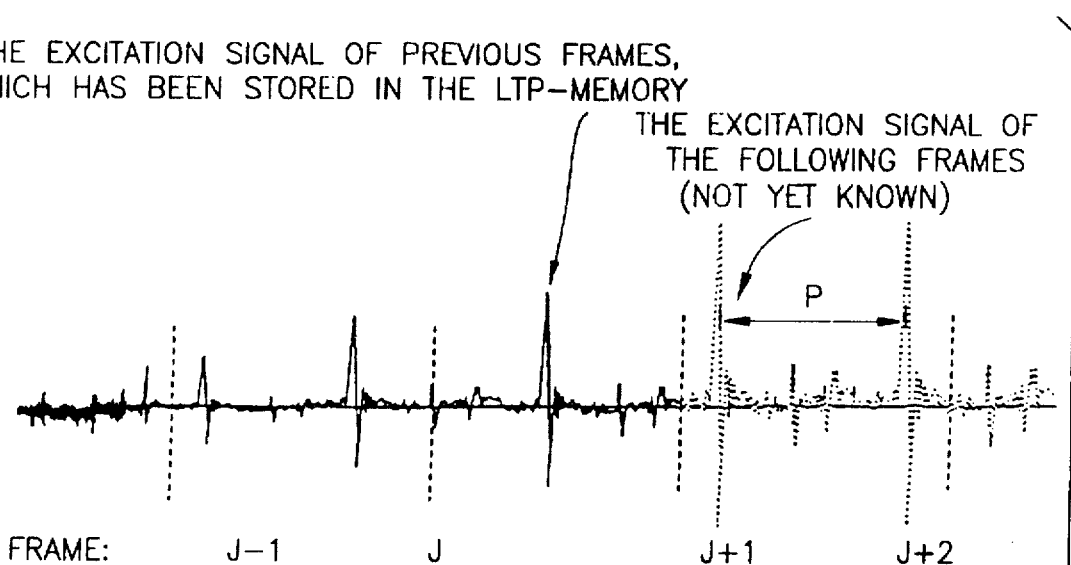
FIG. 2 shows different types of delays of the synthesis filter.
Figure 2:
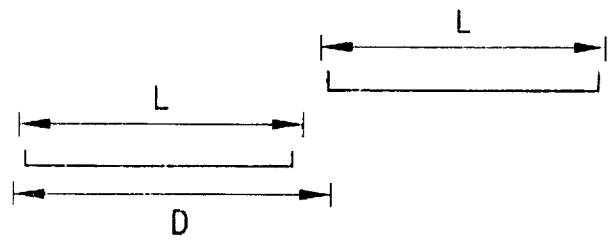
Figure 2:
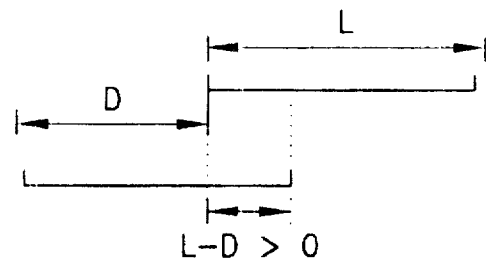

FIGS. 1 and 2 have been discussed above. An embodiment of a first aspect of the invention is described below with reference to FIGS. 3 to 6.

Figure 3:
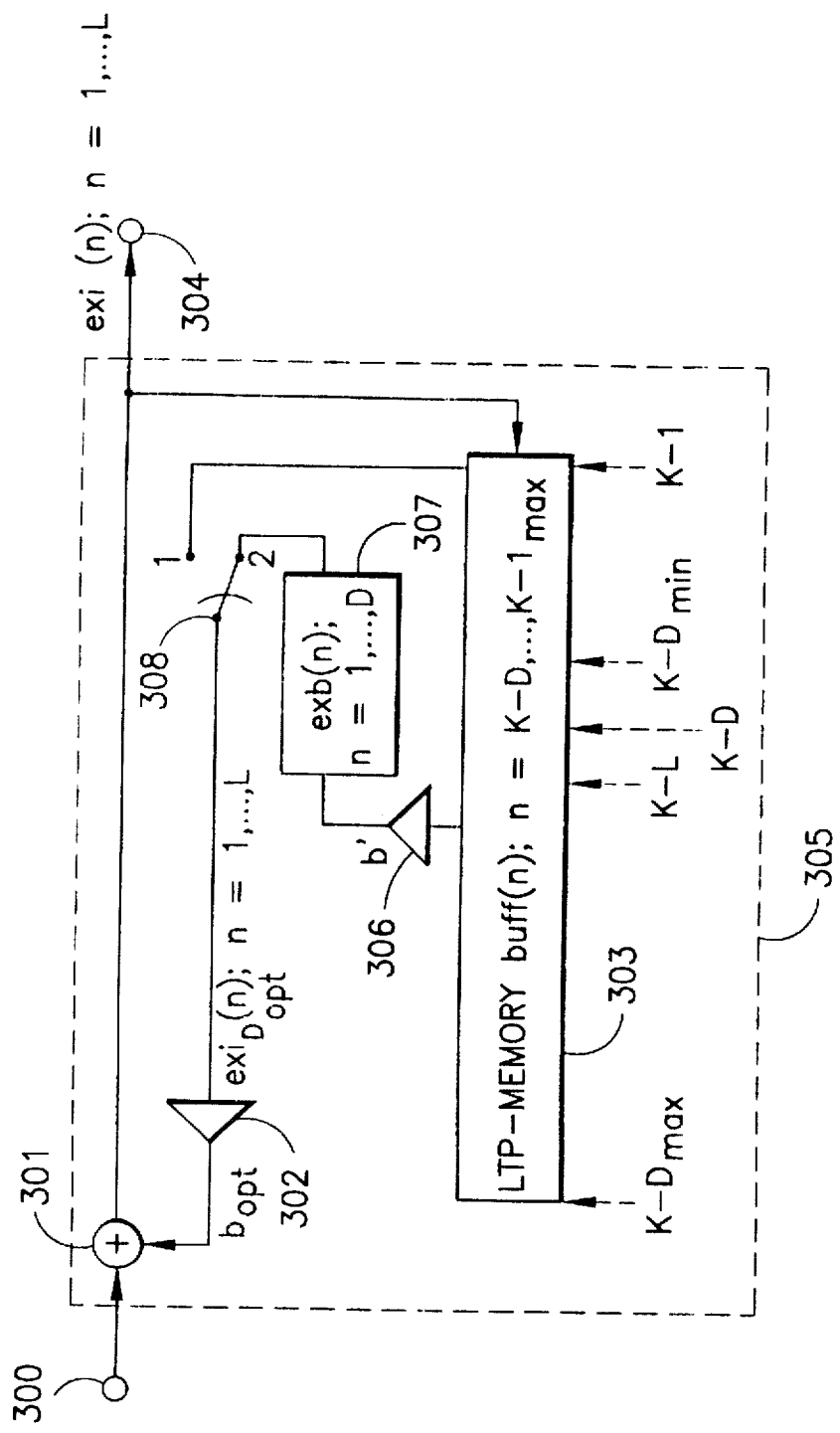
FIG. 3 shows a block diagram of the internal structure of a long-term synthesis filter in accordance with the invention.

FIG. 3 shows a block diagram of the internal structure of a long-term synthesis filter 305 in accordance with the invention. The filter comprises the LTP memory 303 (buff (n); n=K-$D_{max}$, ..., K-1) where, from an appropriate point K-$D_{opt}$ a vector L samples long and scaled by the coefficient $b_{opt}$ 302 is selected to be used as an optimal excitation vector $exi(n)$; n=1, ..., L 304. In the figure, a zero value signal is supplied to the adder 301 at the input 300 because, for the sake of simplicity, it is assumed that more than one excitation signal will not be optimized simultaneously.

An embodiment in accordance with the first aspect of the present invention has a part of the synthesis filter memory an auxiliary memory 307 for exb(n); n=1, ... D, partial-frame signal which is used to create a portion of the excitation signal when the required or optimal delay value is smaller than the sub-frame. A vector from the LTP memory "buff (n)", scaled appropriately with the scaling coefficient b', is supplied to the auxiliary memory via amplification block 306. The partial excitation vector scaled by the coefficient b', and supplied to the auxiliary memory, is used if optimization of the LTP parameters (i.e. samples n=1, ..., L) falls into a region in which a part of the signal required for the current optimization belongs to the frame that is to be optimized i.e. a region outside of the buffer. An approximation for the missing part of the signal, which is needed for optimization or synthesis, is obtained from the prescaled partial excitation vector exb(n) stored in the auxiliary memory, by means of switch 308.

Figures 1, 4A:
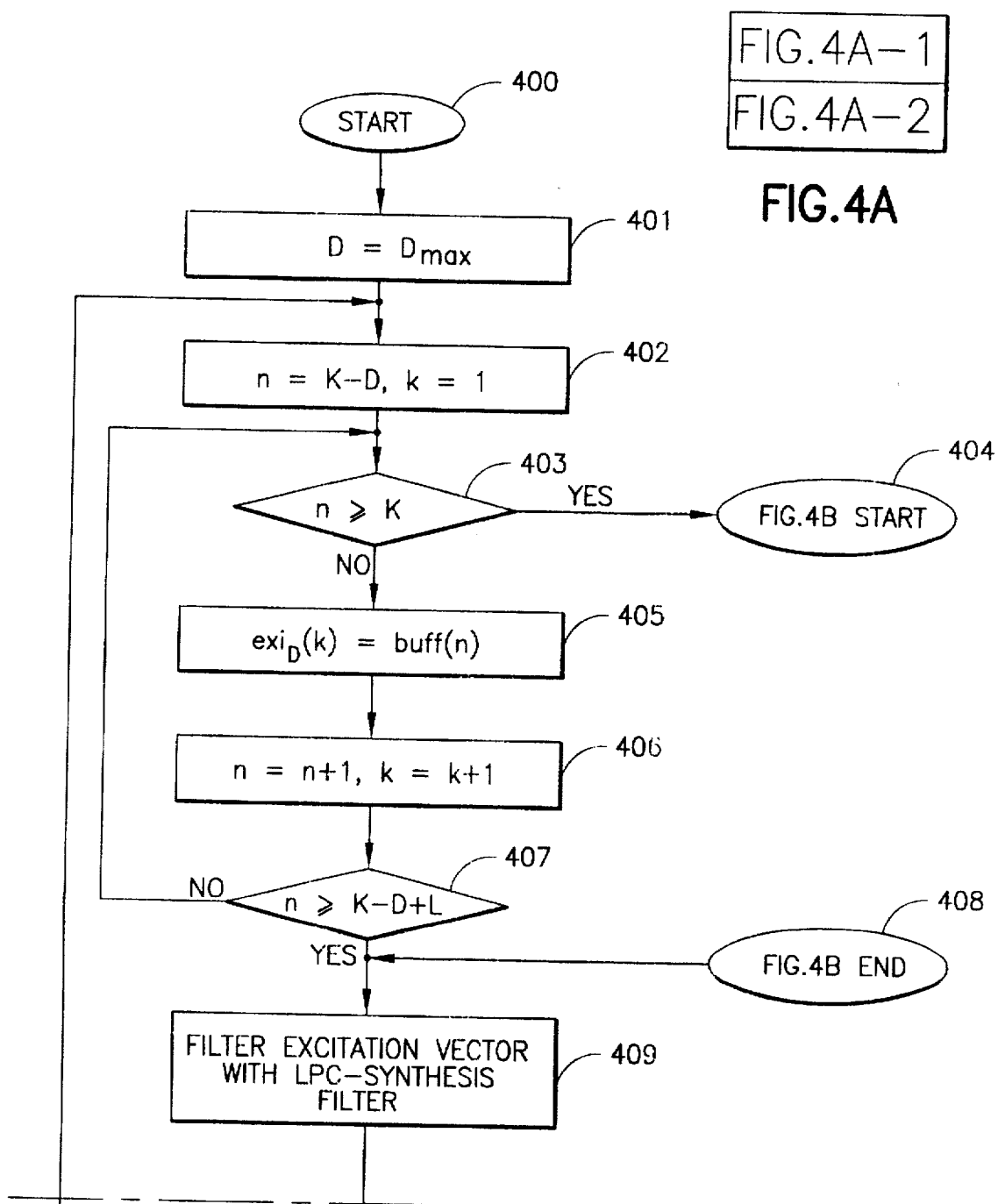
FIGS. 4A and 4B show a flowchart of the search for an optimal excitation signal in accordance with the invention.

FIG. 4A shows a flowchart of the search for the optimal excitation in accordance with the invention. The left-hand side of the figure shows the search procedure for excitation parameters when D is greater than or equal to L samples. On the left-hand side of the figure, the delay values from the maximum value $D_{max}$ to the minimum value, $D_{min}$, are processed forming for each possible value of D a corresponding excitation vector $exi_D(n)$; n=1, ..., L. The best delay value and scaling coefficient are selected by calculating, using a method known in the field, the cross correlation term R(D) of the excitation vector's response and the target signal (the original speech signal) for the entire time of the sub-frame n=1, ..., L.

Figures 2, 4A:
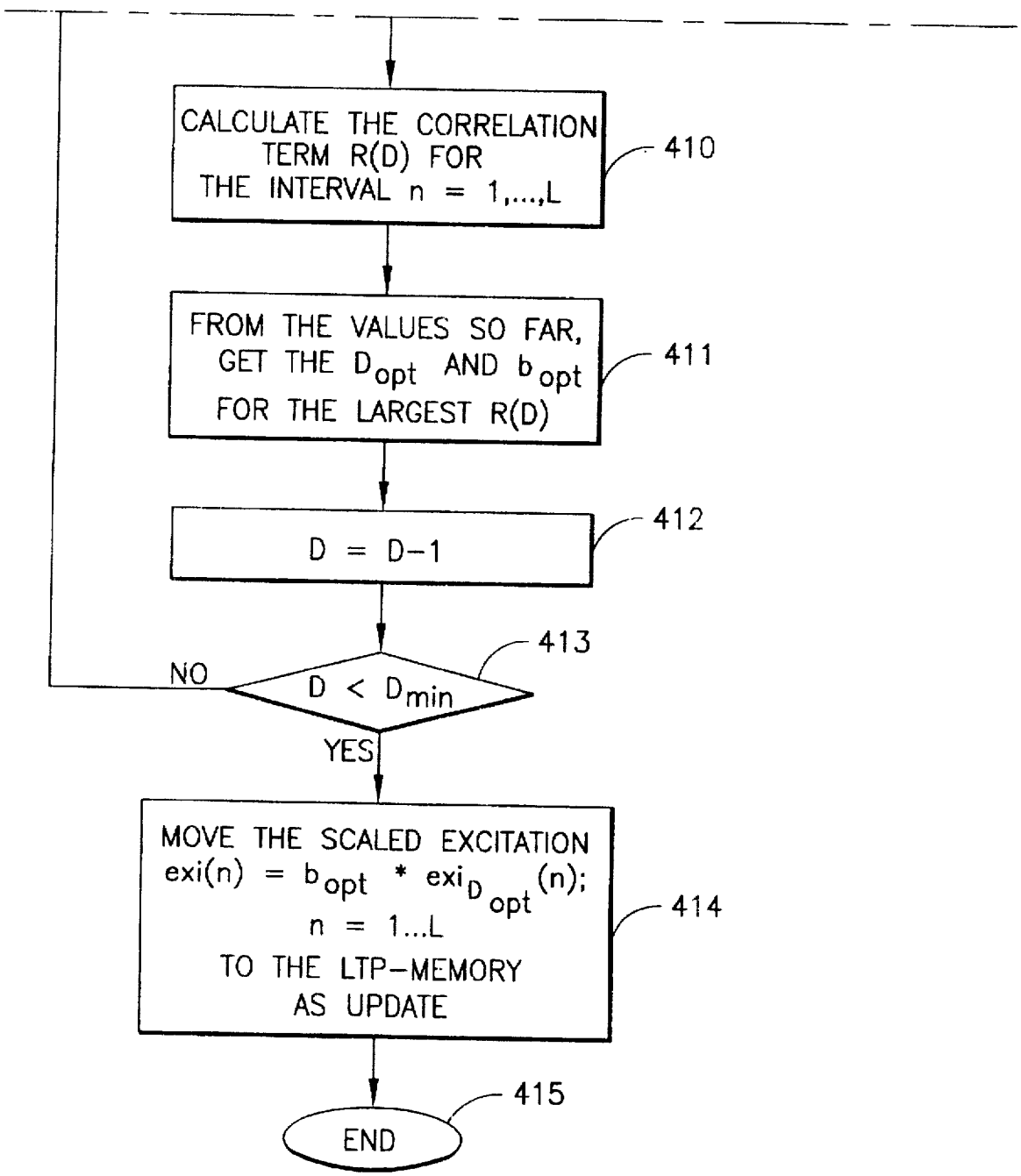

In FIG. 4 the optimization is started from block 400. In block 401 the search for the delay values D is initialized to start from its maximum value and in block 402 a pointer to the corresponding portion of the LTP memory is formed. In block 403 a test is made to determine whether the pointer has strayed into the actual or current delay value range, the sub-frame that is being optimized (n≧K). If the pointer points to excitation values that are not yet known, the program switches to the operations on the right-hand side of the figure (413). If the pointer is in the synthesis filter's memory range (K-$D_{max}$≦n≧K), each sample value of the unscaled excitation vector is formed in block 405 and the procedure is repeated by means of block 406 by moving ahead until an excitation vector has been formed for L samples. Switch 308 of FIG. 3 is thus in position 1 at this time. A test of the sub-frame length is carried out in block 407. In block 408 a return is made from the operations on the right-hand side of the figure to the basic part of the routine. When block 409 is reached, an excitation vector for L samples has been formed for all instances of the vector $exi_D(n)$; n=1, ..., L, including those instances where D≧L.

In block 409 each unscaled excitation vector $exi_D(n)$; n=1, ..., L is supplied to the LPC synthesis filter and in block 410 the correlation of the LPC synthesis filter's output $V_D(n)$; n=1, ..., L with the target signal is calculated for a correlation interval of length L according to formula (3). In block 411 the correlation term R(D) calculated for each delay value D is compared with the maximum value of the previously calculated correlation terms. If the given delay value that is being tested yields a correlation value higher than the previous values, the given delay value is selected as the optimal delay value $D_{opt}$ and the corresponding scaling coefficient as the optimal scaling coefficient $b_{opt}$. In block 412 the next delay value is taken for processing and the optimization process continues if the testing carried out in block 413 does not indicate that all the delay values have already been tested.

When all the delay possibilities have been processed and the optimal excitation signal has been found, the LTP memory is updated in block 414. The optimization algorithm for the LTP parameters is terminated in block 415.

Figure 4B:
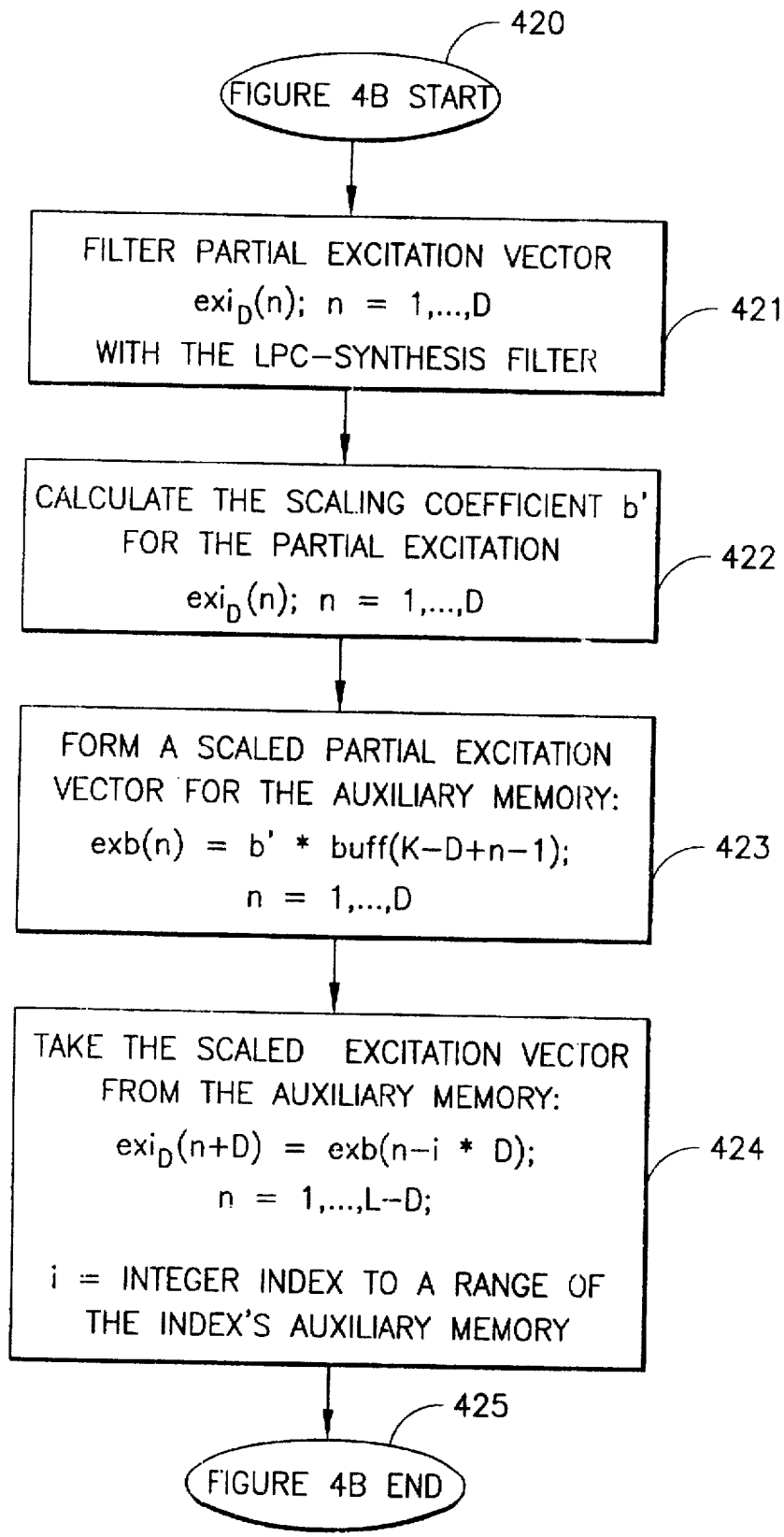

Should application of the left-hand part of the algorithm in FIG. 4A use sample values that are not yet in the LTP memory (n≧K), the program goes over to the procedure on the right-hand side that is shown in FIG. 4B. The processing begins with block 421 in which the LPC synthesis filter calculates the response $V'_D(n)$; n=1, ..., D of the partial excitation vector of length D that was formed in the left-hand part of FIG. 4A, i.e., of the vector $exi_D(n)$; n=1, ..., D. In block 422 the scaling coefficient b' is calculated for the partial excitation in the same way as the scaling coefficient b by forming the partial excitation's response and correlating it with the signal to be modelled using a correlation interval of length D. The calculation is carried out only for those sample values for D which are known, i.e., only within the length of the partial excitation n=1, ..., D $$b' = \frac{\left( \sum_{i=1}^{D} v'_D(i)s(i) \right)}{\sum_{i=1}^{D} v'_D{}^2(i)} \quad (5)$$

In block 423 the scaling coefficient calculated for the partial excitation is used to form an approximation of the unknown part of the signal, that is supplied to the auxiliary memory, as follows:

$$exb(n)=b' * buff(K-D+n-1); n=1, \ldots, D. \quad (6)$$

The missing pat of the excitation signal required by the analysis by synthesis method is obtained from the auxiliary memory in block 424. The switch 308 in FIG. 3 has, thus, moved to position 2.

$$exi_D(n+D)=exb(n-i*D); n=1, \ldots, L-D, \quad (7)$$

in which i*D; i=0,1, ... is the multiple of D which takes the pointer to the auxiliary memory area. If 1 (L/D≦2, then i receives the value 0 and if 2) L/D≦3, then i receives the values 0 and 1 such that a hit is always made in the specified area n=1, ..., D of the auxiliary memory exb(n); n=1, ..., D etc. When the end part of the excitation signal has thus been formed, the program returns to the main routine.

When returning to the left-hand side of FIG. 4A, the calculation carried out in blocks 421 and 422 can be utilized in the calculation of blocks 409 and 410, which means that the amount of work the algorithm requires does not grow substantially even though an extra correlation term has to be calculated in order to form part of the missing signal.

The above-described synthesis filter method concerns the calculation of the excitation parameters to be carried out in the encoder. It is nevertheless expedient to also use a synthesis filter in accordance with the invention in a decoder in order to achieve equivalence with the encoder's optimization procedure. In the decoder it would also be possible to implement a synthesis filter delay that is shorter than the sub-frame even with a conventional filter structure.

Figure 5:
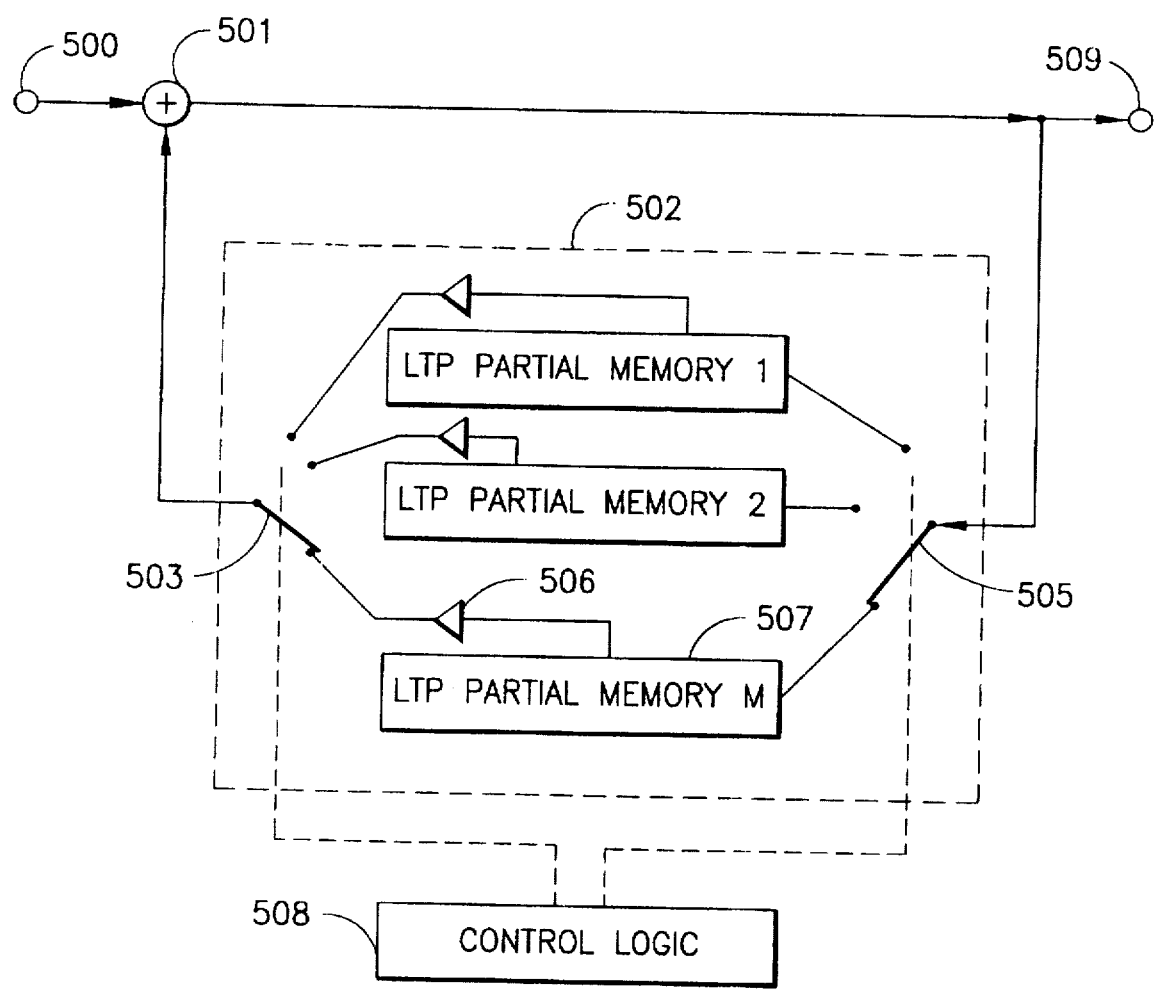
FIG. 5 shows a block diagram of the implementation of a synthesis filter in accordance with the invention by means of several parallel, separately updatable partial memories.

FIG. 5 shows a block diagram of an embodiment of a second aspect of the invention by means of a number of parallel separately updatable partial memories. The figure sets forth the use of several adaptive code books, which is an additional feature of the invention, and the updating of the code books under the control of a switch structure. Within the long-term synthesis filter the use of several code books makes it possible to search a group of excitation vectors for often-used excitation types which are classified as active and which precede the sub-frame to be synthesized by what can be a large amount. In the synthesis filter according to the second aspect of the invention, instead of one synthesis filter memory, several (M in number) synthesis filter blocks 507 and amplification coefficients 506 are used.

Only the partial memory used to form an excitation signal at any given time is updated and the synthesis filter's other partial memories are left in the old state without adapting them at all. The method makes it possible to retain the content of the LTP memories that have been unused for a fairly long time for subsequent use in the state they were in when last used. Accordingly, it is possible to retain in them a usable excitation for times that are longer than the synthesis filtering method known in the field.

Switch 503 which selects the excitation signal and switch 505 which selects the LTP partial memory to be updated, function in synchrony with each other. If, however, a partial memory of the synthesis filter is not used as an excitation for several (T in number) frames, its content is updated with an excitation vector formed by an excitation signal from the active partial memory. In this case, the control logic 508 that controls the partial memories' updating desynchronizes the switches for an instant and, by way of exception, updates a partial memory that is different from the one from which the excitation signal has been taken.

The excitation signal formed is obtained from the synthesis filter's output 509. A simultaneous optimization of the additional excitation can be carried out by adding it to the LTP excitation via the adder means 501 of input 500.

Figure 6:
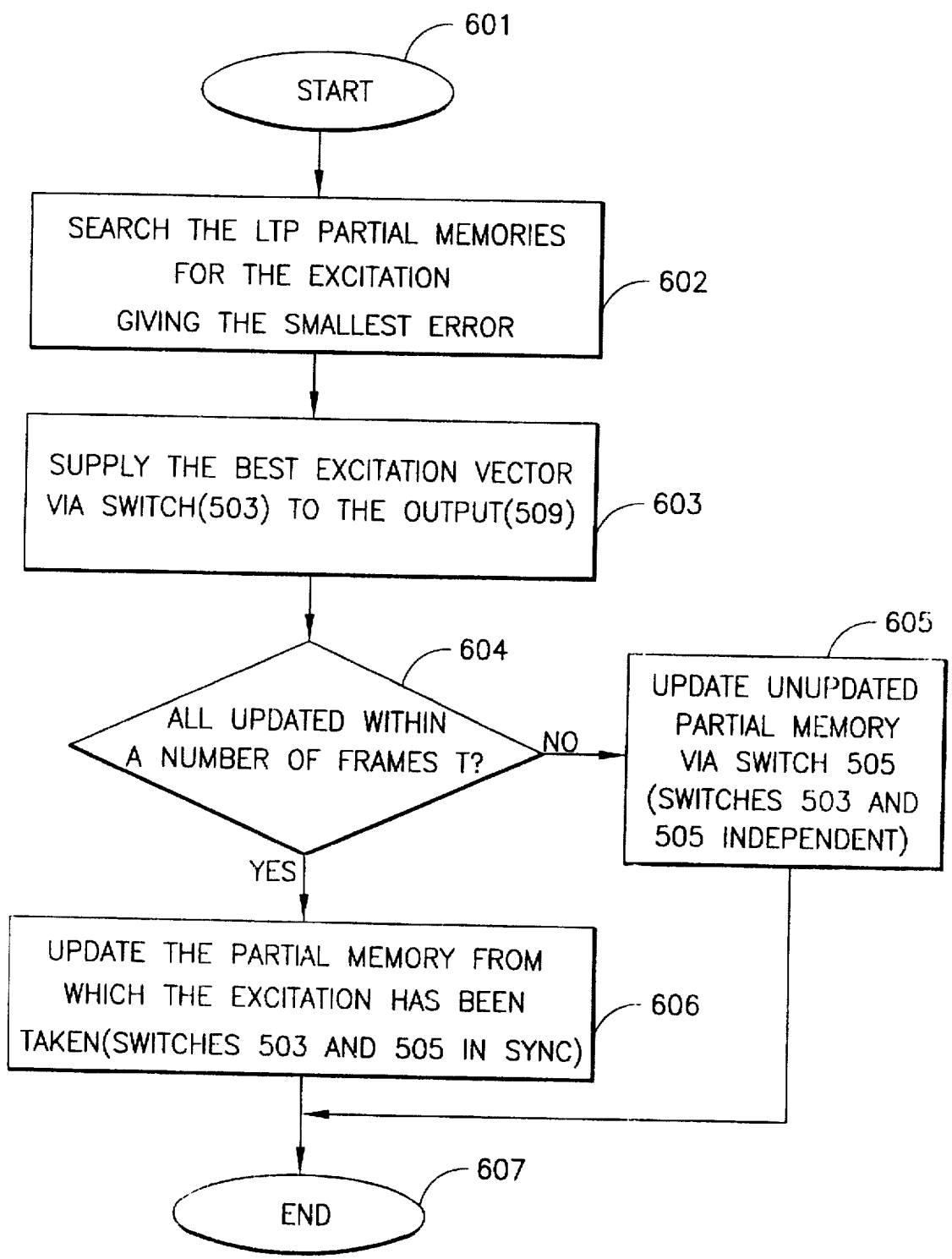
FIG. 6 presents a flow chart of a long-term filter composed of partial memories in accordance with the invention.

FIG. 6 shows a flowchart of a long-term filter composed of partial memories. In block 601 the synthesis filter's operation for each sub-frame is started. In block 602 the content of the partial memories is searched for the excitation vector giving the smallest error and a suitable scaling coefficient is calculated for it, for example, by using the calculation in the previously described two-stage procedure. Each partial memory can contain several excitation vectors each of a sub-frame in length. In block 603 the scaled vector that was selected from the memory is applied as an excitation in such a way that the partial memory from which the given vector has been selected is activated with switch 503. In testing block 604 a check is made to verify that all the partial memories have been in use within a reasonable time during formation of the excitation (they have been selected at least once during T frames before the last coded frame). If all the partial memories have been in use sufficiently frequently, in block 606 that partial memory, from which the excitation vector was selected is updated, i.e., switch 505 is set to point to the partial memory from which the excitation signal has been taken via switch 503. Otherwise only the partial memory classified as having been unused too long according to block 605 is updated instead of updating the partial memory from which the excitation was taken. The formation of each frame's excitation vector is terminated in block 607.

In speech coders operating on the analysis-by-synthesis principle, the invention makes it possible to implement the kinds of high fundamental frequencies which have a corresponding cycle time that is smaller than the frame length of the analysis-by-synthesis structure. The invention is based on the use of a two-stage algorithm, in the first stage of which an approximation is created for the signal for the beginning of the sub-frame that is being optimized and in the second stage, calculation of the coder's parameters is carried out using the signal approximation thus formed, this calculation extending to delay values that are shorter than the analysis-by-synthesis frame.

An additional feature of the invention is the use of several parallel separately adaptable synthesis memory blocks inside one synthesis filter. In a long-term synthesis filter, the use of several separate memory blocks makes it possible to search for an excitation vector in a group of often-used (active) types of excitation that greatly antedate to the sub-frame to be synthesized.

All in all, with the method in accordance with the invention it is thus possible, on the one hand, to achieve short prediction delay times (i.e., high fundamental frequencies) with greater fidelity than with previously presented methods and, on the other hand, in optimizing the parameters coded, the use of separately adaptable partial memories permits the utilization of excitation signals that correspond to very large delay times and have been formed a long time earlier.

In the encoder in FIG. 1, which conforms to the prior art, it is possible to use, with the method in accordance with the invention, delay values that are smaller than the length of the long-term analysis-by-synthesis frame. Several parallel synthesis memory blocks in accordance with the invention can be used not only with speech coders operating on the analysis-by-synthesis principle, but also in more conventional so-called "open system" coders which do not involve the execution in the encoder of synthesization of the speech signal with different synthesis parameter values, which is akin to the analysis-by-synthesis methods, and the ensuing error checking is based on the actual synthesis result.

In view of the foregoing description it will be evident to a person skilled in the art that various modifications may be made within the scope of the invention.

The scope of the present disclosure includes any novel feature or combination of features disclosed explicitly herein or any generalization thereof, irrespective of whether or not it relates to the claimed invention or mitigates any or all of the problems addressed by the present invention. The applicant hereby gives notice that new claims may be formulated to such features during prosecution of this application or of any further application derived therefrom.

What I claim is:

1. A method for operating a long-term synthesis filter utilising an analysis-by-synthesis procedure, said procedure comprising the steps of:

reading signals of a predetermined length stored in portions of an adaptive code book corresponding to different delay values and utilising the signals for forming respective synthesis signals, comparing the respective synthesis signals with a target signal to determine their decree of correlation and forming respective error signals indicative of the degree of correlation between a respective synthesis signal and the target signal, and selecting a synthesis signal producing the greatest degree of correlation for synthesis and storing said selected signal in an auxiliary memory means for an adaptive code book when a delay value is less than or equal to the predetermined length.

2. A method as set forth in claim 1, wherein the predetermined length corresponds to a sub-frame of length L, the delay value is D, and D<L.

3. A method as set forth in claim 2, wherein the adaptive code book's parameters are optimized by a two-stage routine using an appropriately-scaled partial signal that is routed through said auxiliary memory means for use as a partial synthesis signal for a missing portion of the target signal when delay values shorter than the length of the sub-frame are used, whereby shorter delay values can be optimally processed by the synthesis filter.

4. A method as set forth in claim 2, wherein said selected signal updates the same adaptive code book from which the signal has been selected for use in the analysis-by-procedure synthesis.

5. A method as set forth in claim 2, wherein an adaptive code book that has not been used to provide a signal within less than predetermined number of frames T is updated with a signal formed by scaling said signal read from an adaptive code book thereby updating a different adaptive code book from the one from which the signal has been taken.

6. The method of claim 1, wherein said signal having the greatest correlation is stored in one of a plurality of separately-updatable adaptive code books, whereby signals that greatly antedate the optimization of a given target signal can be used in the optimization of that signal.

7. The method of claim 6, wherein the signals of predetermined length are stored in portions of an adaptive code book corresponding to different delay values, and an auxiliary memory means is provided for use when the signals corresponding to delay values less than or equal to the predetermined length provide the best correlation with the target signal.

8. A method, for operating a long-term synthesis filter utilising an analysis-by-synthesis procedure, said procedure comprising the steps of:

reading signals of a predetermined length stored in portions of an adaptive code book corresponding to different delay values and utilising the signals for forming respective synthesis signals, comparing the respective synthesis signals with a target signal to determine their decree of correlation and forming respective error signals indicative of the degree of correlation between a respective synthesis signal and the target signal, and selecting a synthesis signal producing the greatest degree of correlation for synthesis and storing said selected signal in an auxiliary memory means for an adaptive code book when a delay value is less than or equal to the predetermined length;

wherein the predetermined length corresponds to a sub-frame of length L, the delay value is D, and D<L;

wherein the adaptive code book's parameters are optimized by a two-stage routine using an appropriately-scaled partial signal that is routed through said auxiliary memory means for use as a partial synthesis signal for a missing portion of the target signal when delay values shorter than the length of the sub-frame are used, whereby shorter delay values can be optimally processed by the synthesis filter; and wherein the two-stage routine comprises:

a first stage for forming a signal corresponding to the beginning of the sub-frame being processed and calculating a scaling coefficient b' corresponding to the partial signal length $n=1, \ldots D$ for scaling the signal stored in the auxiliary memory means, thereby forming a signal $exi_D(n); n=D+1 \ldots L$ corresponding to the missing portion of the signal to be optimised, and a second stage wherein the signal $exi_{(D)[}.]$ is used as the missing portion of the signal, whereby analysis of the long-term filter's parameters is extended to delay values shorter than the length of the sub-frames.

9. A method as set forth in claim 8, wherein said scaling coefficient is calculated by a correlation procedure using a correlation interval that is D samples long.

10. A method for operating a long-term synthesis filter utilising an analysis-by-synthesis procedure, said procedure comprising the steps of:

reading signals of a predetermined length stored in portions of an adaptive code book corresponding to different delay values and utilising the signals for forming respective synthesis signals, comparing the respective synthesis signals with a target signal to determine their degree of correlation and forming respective error signals indicative of the degree of correlation between a respective synthesis signal and the target signal, and selecting a synthesis signal producing the greatest degree of correlation for synthesis and storing said selected signal in an auxiliary memory means for an adaptive code book when a delay value is less than or equal to the predetermined length;

wherein the predetermined length corresponds to a sub-frame of length L, the delay value is D, and D<L;

wherein an adaptive code book that has not been used to provide a signal within less than predetermined number of frames T is updated with a signal formed by scaling said signal read from an adaptive code book thereby updating a different adaptive code book from the one from which the signal has been taken; and further comprising the steps of:

supplying a control signal so that the adaptive code book from which the signal has been selected is activated by setting a first switch, checking that all the adaptive code books have been activated within a reasonable time, while forming the signal, setting another switch via said first switch so as to update an adaptive code book that has been unused too long.

11. A method for operating a long-term synthesis filter utilising an analysis-by-synthesis procedure, said procedure comprising the steps of:

reading signals of a predetermined length stored in portions of an adaptive code book corresponding to different delay values and utilising the signals for forming respective synthesis signals, comparing the respective synthesis signals with a target signal to determine their degree of correlation and forming respective error signals indicative of the decree of correlation between a respective synthesis signal and the target signal, and selecting a synthesis signal producing the greatest degree of correlation for synthesis and storing said selected signal in an auxiliary memory means for an adaptive code book when a delay value is less than or equal to the predetermined length;

wherein the predetermined length corresponds to a sub-frame of length L, the delay value is D, and D<L; and wherein the filter optimizes coding by:

beginning a search of a range of delay values from the maximum delay value in said range, initializing a pointer to the corresponding portion of the adaptive code book, testing whether said search has strayed into a portion of said delay value range corresponds to the length of the sub-frame that is being optimized, so that n is equal to or greater than K, forming a value for each sample of an unscaled signal in said portion of the book until a signal comprising L samples has been formed, testing the length, of said signal formed of said values, calculating the response of a partial signal thus formed in an LPC synthesis filter, calculating a scaling coefficient b' for the partial signal by forming the response of the partial signal and correlating it with the signal to be modelled with a correlation interval of length D, forming for the partial signal an approximation for the missing part of the signal, this being supplied to the auxiliary memory means, taking the missing part of said signal of predetermined length needed for the analysis-by-synthesis procedure from the auxiliary memory means, supplying each unamplified signal to the LPC synthesis filter, calculating the correlation of the output of the LPC synthesis filter with the target signal for a correlation interval of length L, comparing a respective correlation calculated for each delay value with the maximum value of the previously calculated correlation for said delay values selecting the delay value, corresponding to any correlation value that is higher than the previous ones as the optimal delay value and the corresponding scaling coefficient as the optimal scaling coefficient $b_{opt}$, repeating the correlation comparison and optimal value and coefficient selection for the next delay value until all the delay values have been tested, and updating the adaptive code book.

12. A method as set forth in claim 11, wherein the previously performed calculation of the partial signal response and the scaling coefficient b' is utilized in calculating the signals and the correlations.

13. A long-term synthesis filter for an analysis-by-synthesis procedure using a synthesis signal, said filter comprising:

an adaptive code book; and an auxiliary memory means corresponding to said adaptive code book for storing signals, said auxiliary memory means supplying a partial excitation signal for use in approximating a missing portion of the synthesis signal when delay values are shorter than or equal to a predetermined length.

14. A long-term synthesis filter for an analysis-by-synthesis procedure as set forth in claim 13, wherein said adaptive code book is comprised of a first adaptive code book and a second adaptive code book that are individually selectable for updating and use in the analysis of the synthesis signal.

15. A long-term predictive synthesis filter for an analysis-by-synthesis procedure, said filter comprising:

an adaptive code book; and an auxiliary memory means corresponding to said adaptive code book, said auxiliary memory means storing signals for use in updating said corresponding adaptive code book when delay values are shorter than or equal to a predetermined length.

16. A long-term synthesis filter for an analysis-by-synthesis procedure using a synthesis signal, said filter comprising:

an adaptive code book; and an auxiliary memory means corresponding to said adaptive code book for storing signals, said auxiliary memory means supplying a partial excitation signal for use in approximating a missing portion of the synthesis signal when delay values are shorter than or equal to a predetermined length;

said filter comprising a first and a second adaptive code book individually selectable for updating and use in the analysis of the synthesis signal;

wherein each adaptive code book is associated with a respective scaling coefficient and the filter includes a switch that selects a signal from said adaptive code books, said filter further comprising a switch that selects an adaptive code book to be updated as well as control logic for updating the adaptive code books.

17. A synthesis as set forth in claim 16, wherein a number of separate adaptive code books provide an additional signal.

18. A synthesis filter as set forth in claim 16, wherein the signal selected from the code book has a predetermined length that corresponds to a sub-frame of length L.

19. A synthesis filter as set forth in claim 16, wherein a signal L samples long is selected from an appropriate portion of an adaptive code book and supplied from the adaptive code book to an amplification block in which the signal is scaled by the code book's respective scaling coefficient for use as an optimal signal and to an auxiliary memory means to which a portion of the scaled signal is supplied, as required.

* * * * *